United States Patent
Zhao et al.

(10) Patent No.: US 8,426,728 B2
(45) Date of Patent: Apr. 23, 2013

(54) QUANTUM DOT SOLAR CELLS

(75) Inventors: Linan Zhao, Shanghai (CN); Zhi Zheng, Shanghai (CN); Marilyn Wang, Shanghai (CN); Xuanbin Liu, Shanghai (CN); Huili Tang, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 826 days.

(21) Appl. No.: 12/484,034

(22) Filed: Jun. 12, 2009

(65) Prior Publication Data

US 2010/0313957 A1    Dec. 16, 2010

(51) Int. Cl.
*H01L 31/00* (2006.01)
*H01L 21/00* (2006.01)

(52) U.S. Cl.
USPC ........... 136/264; 136/260; 977/948; 977/774; 438/86; 438/95

(58) Field of Classification Search ............ 438/85, 438/86, 95; 136/243, 260, 264; 977/948, 977/774
See application file for complete search history.

(56) References Cited

U.S. PATENT DOCUMENTS

| | | |
|---|---|---|
| 4,427,749 A | 1/1984 | Graetzel et al. |
| 4,927,721 A | 5/1990 | Gratzel et al. |
| 5,677,545 A | 10/1997 | Shi et al. |
| 6,278,056 B1 | 8/2001 | Sugihara et al. |
| 6,566,595 B2 | 5/2003 | Suzuki |
| 6,861,722 B2 | 3/2005 | Graetzel et al. |
| 6,919,119 B2 | 7/2005 | Kalkan et al. |
| 6,936,143 B1 | 8/2005 | Graetzel et al. |
| 7,032,209 B2 | 4/2006 | Kobayashi |
| 7,042,029 B2 | 5/2006 | Graetzel et al. |
| 7,091,136 B2 | 8/2006 | Basol |
| 7,202,412 B2 | 4/2007 | Yamanaka et al. |
| 7,202,943 B2 | 4/2007 | Chang et al. |
| 7,268,363 B2 | 9/2007 | Lenhard et al. |
| 7,462,774 B2 | 12/2008 | Roscheisen et al. |
| 7,563,507 B2 | 7/2009 | Emrick et al. |
| 7,655,860 B2 | 2/2010 | Parsons |

(Continued)

FOREIGN PATENT DOCUMENTS

| | | |
|---|---|---|
| EP | 1473745 | 11/2004 |
| EP | 1689018 | 8/2006 |

(Continued)

OTHER PUBLICATIONS

Diguna et al., "High Efficiency of CdSe Quantum-Dot-Sensitized TiO2 Inverse Opal Solar Cells," Applied Physics Letters, vol. 91, No. 023116, 3 pages, 2007.

(Continued)

*Primary Examiner* — Matthew Smith
*Assistant Examiner* — Wilner Jean Baptiste
(74) *Attorney, Agent, or Firm* — Seager Tufte & Wickhem LLC

(57) ABSTRACT

Solar cells and methods for manufacturing solar cells and/or components or layers thereof are disclosed. An example method for manufacturing a multi-bandgap quantum dot layer for use in a solar cell may include providing a first precursor compound, providing a second precursor compound, and combining a portion of the first precursor compound with a portion of the second precursor compound to form a multi-bandgap quantum dot layer that includes a plurality of quantum dots that differ in bandgap.

20 Claims, 2 Drawing Sheets

U.S. PATENT DOCUMENTS

| | | | |
|---|---|---|---|
| 2002/0006470 A1* | 1/2002 | Eberspacher et al. | 427/216 |
| 2005/0028862 A1 | 2/2005 | Miteva et al. | |
| 2006/0021647 A1 | 2/2006 | Gui et al. | |
| 2006/0169971 A1 | 8/2006 | Cho et al. | |
| 2006/0207644 A1* | 9/2006 | Robinson et al. | 136/243 |
| 2006/0263908 A1 | 11/2006 | Hirai | |
| 2007/0025139 A1 | 2/2007 | Parsons | |
| 2007/0028959 A1 | 2/2007 | Lee et al. | |
| 2007/0062576 A1 | 3/2007 | Duerr et al. | |
| 2007/0119048 A1 | 5/2007 | Li et al. | |
| 2007/0120177 A1 | 5/2007 | McGregor et al. | |
| 2007/0122927 A1 | 5/2007 | Li et al. | |
| 2007/0123690 A1 | 5/2007 | Parham et al. | |
| 2007/0194694 A1* | 8/2007 | Reddy | 313/503 |
| 2007/0243718 A1 | 10/2007 | Shiratori et al. | |
| 2008/0110494 A1 | 5/2008 | Reddy | |
| 2008/0264479 A1 | 10/2008 | Harris et al. | |
| 2009/0095349 A1* | 4/2009 | Forrest et al. | 136/262 |
| 2009/0114273 A1 | 5/2009 | Kamat | |
| 2009/0159120 A1 | 6/2009 | Wang et al. | |
| 2009/0159124 A1 | 6/2009 | Mihaila et al. | |
| 2009/0159131 A1 | 6/2009 | Zheng et al. | |
| 2009/0159999 A1 | 6/2009 | Zheng et al. | |
| 2009/0211634 A1 | 8/2009 | Serban et al. | |
| 2009/0260682 A1 | 10/2009 | Serban et al. | |
| 2009/0260683 A1 | 10/2009 | Serban et al. | |
| 2009/0283142 A1 | 11/2009 | Serban et al. | |
| 2009/0308442 A1 | 12/2009 | Liu | |
| 2009/0314342 A1* | 12/2009 | Bent et al. | 136/256 |
| 2010/0006148 A1 | 1/2010 | Zheng et al. | |
| 2010/0012168 A1 | 1/2010 | Mihaila et al. | |
| 2010/0012191 A1 | 1/2010 | Serban et al. | |
| 2010/0043874 A1 | 2/2010 | Liu | |
| 2010/0116326 A1 | 5/2010 | Gur et al. | |
| 2010/0193025 A1 | 8/2010 | Serban et al. | |
| 2010/0193026 A1 | 8/2010 | Serban et al. | |
| 2010/0326499 A1 | 12/2010 | Liu | |

FOREIGN PATENT DOCUMENTS

| | | |
|---|---|---|
| EP | 1936644 | 6/2008 |
| JP | 2008177099 | 7/2008 |
| WO | WO 2004/017345 | 2/2004 |
| WO | WO 2006/073562 | 7/2006 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

Banerjee et al., "Synthesis and Characterization of Carbon Nanotube-Nanocrystal Heterostructures," Nano Letters, vol. 2, No. 3, pp. 195-200, 2002.

Clarke et al., "Photophysics of Dopamine-Modified Quantum Dots and Effects on Biological Systems," Nature Materials, vol. 5, pp. 409-417, May 2006.

Gebeyehu et al., "Hybrid Solar Cells Based on Dye-Sensitized Nanoporous $TiO_2$ Electrodes and Conjugated Polymers as Hole Transport Materials," Synthetic Metals, vol. 125, pp. 279-287, 2002.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Landes et al., "On the Nanoparticle to Molecular Size Transition: Flourescence Quenching Studies," vol. 105, No. 43, pp. 10554-10558, 2001.

Law et al., "ZnO-$Al_2O_3$ and ZnO-$TiO_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798, 2007.

Ma et al., "A Sensitive Method for the Detection of Catecholamine Based on Fourescence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and $TiO_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Wu et al., "Phosphate-Modified $TiO_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, 7 pages, Jun. 2005.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol Et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enescu, Medicamente, pp. 292-293, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nanopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.

Hwang et al., "A Highly Efficient Organic Sensitizer for Dye-Sensitized Solar Cells," Chemical Communications, 5 pages, printed Sep. 27, 2007.

ISBN No. 7-04-009141-0, 8 pages, 2001, 2003.

ISBN No. 978-7-03-015873-4, 8 pages, 2005.

Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.

Kim et al., "Enhanced Photocatalytic Activity in Composites of $TiO_2$ Nanotubes and Cds Nanoparticles," Chem. Commun., pp. 5024-5026, 2006.

Klimov, "Spectral and Dynamical Properties of Multiexcitons in Semiconductor Nanocrystals," ANRV, vol. 308-PC58-24, pp. 635-673, Dec. 2, 2006.

Kouklin et al., "Ultradense GaN Nanopillar and Nanopore Arrays by Self-Assembly and Nanopatterning," Journal of Electronic Materials, vol. 35, No. 5, pp. 1133-1137, May 2006.

Kuzyk, "Erratum: Physical Limits on Electronic Nonlinear Molecular Susceptibilities," Physical Review Letters, vol. 90, No. 3, 1 page, Jan. 2003.

Kuzyk, "Fundamental Limits on Third-Order Molecular Susceptibilities," Optics Letters, vol. 25, No. 16, pp. 1183-1185, Aug. 15, 2000.

Kuzyk, "Physical Limits on Electronic Nonlinear Molecular Susceptibilities," Physical Review Letters, vol. 85, No. 6, pp. 1218-1221, Aug. 7, 2000.

Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.

Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.

Li et al., "Band-Structure-Corrected Local Density Approximation Study of Semiconductor Quantum Dots and Wires," Physical Review B., vol. 72, 15 pages, 2005.

Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, 11 pages, May 1956.

Marcus, "On the Theory of Oxidation-Reduction Reactions Involving Electron Transfer. I," The Journal of Chemical Physics, vol. 24, No. 5, 13 pages, May 1956.

Meier et al., "Fast Electron Transfer Across Semiconductor-Molecule Interfaces: $GaAs/Co(Cp)_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized $TiO_2$ Solar Cells: Shielding Versus Band-Edge Movement," Journal of Physical Chemistry B., vol. 109, No. 49, pp. 23183-23189, 2005.

Nenitescu, Chimie Organica, vol. I, p. 522, 1980.

Nenitescu, Chimie Organica, vol. II, p. 581, 1980.

Nilsing et al., "Phosphonic Acid Adsorption at the $TiO_2$ Anatase (101) Surface Investigated by Periodic Hybrid HF-DFT Computations," Surface Science, vol. 582, pp. 49-60, 2005.

Nozick et al., "Quantum Dot Solar Cells," Physica E, vol. 14, pp. 115-120, 2002.

O'Reagan et al., "A Low-Cost, High Efficiency Solar Cell Based on Dye-Sensitized Colloidal $TiO_2$ Films," Nature, vol. 353, pp. 737-740, Oct. 24, 1991.

Oyaizu et al., "Linear Ladder-Type Conjugated Polymers Composed of Fused Thiophene Ring Systems," Macromolecules, vol. 37, No. 4, pp. 1257-1270, 2004.

Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.

Perez-Moreno et al., "Modulated Conjugation as a Means for Attaining a Record High Intrinsic Hyperpolarizability," Optics Letters, vol. 32, No. 1, pp. 59-61, Jan. 1, 2007.

Pomerantz et al., "Synthesis and Properties of Poly[3-(w-bromoalkyl)thiophene]," Synthetic Metals, vol. 101, 1 page, 1999.

Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.

Qian et al., "Gallium Nitride-Based Nanowire Radial Heterostructures for Nanophotonics," NanoLetters, vol. 4, No. 10, pp. 1975-1979, 2004.

Qiu et al., "Fabrication of $TiO_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic $TiO_2$ Films," Journal of the American Chemical Society, vol. 128, No. 7, pp. 2385-2393, 2006.

Robel et al., "Size-Dependent Electron Injection from Excited CdSeQuantum Dots into $TiO_2$ Nanoparticles," JACS Communications, 2 pages, Mar. 21, 2007.

Wang et al. "Enhance the Performance of Dye-Sensitized Solar Cells by Co-grafting Amphiphilic Sensitizer and Hexadecylmalonic Acid on $TiO_2$ Nanocrystals," Journal of Physical Chemistry B., vol. 107, No. 51, pp. 14336-14341, 2003.

Wu et al., "Superior Radiation Resistance of $In_{1-x}Ga_xN$ Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline $TiO_2$ Films by Organic Sensitizers," Chemical Communications, 7 pages, printed Sep. 27, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

U.S. Appl. No. 13/006,410, filed Jan. 13, 2011.

Rafaelle et al., "Quantum Dot—Single Wall Carbon Nanotube Complexes for Polymeric Solar Cells," IEEE, 4 pages, 2005.

Shen et al., "Photoacoustic and Photoelectrochemical Characterization of CdSe-Sensitized $TiO_2$ Electrodes Composed of Nanotubes and Nanowires," Thin Solid Films, vol. 499, pp. 299-305, 2006.

Chang et al., "Chemical Bath Deposition of CdS Quantum Dots Onto Mesoscopic $TiO_2$ Films for Application in Quantum-Dot-Sensitized Solar Cells," Applied Physics Letters, vol. 91, 3 pages, 2007.

U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.
Hodes, "Chemical Solution Deposition of Semiconductor Films," Marcel Dekker Inc., 381 pages, 2002.
Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

* cited by examiner

QUANTUM DOT SOLAR CELLS

TECHNICAL FIELD

The disclosure relates generally to solar cells. More particularly, the disclosure relates to quantum dot solar cells and methods for manufacturing quantum dot solar cells and/or components or layers thereof.

BACKGROUND

A wide variety of solar cells have been developed for converting sunlight into electricity. Of the known solar cells, each has certain advantages and disadvantages. There is an ongoing need to provide alternative solar cells as well as alternative methods for manufacturing solar cells.

SUMMARY

The disclosure relates generally to solar cells and methods for manufacturing solar cells and/or components or layers thereof. An example method for manufacturing a multi-bandgap quantum dot layer for use in a solar cell may include providing a first precursor compound, providing a second precursor compound, and combining a portion of the first precursor compound with a portion of the second precursor compound to form a multi-bandgap quantum dot layer that includes a plurality of quantum dots that differ in bandgap.

Another example method for manufacturing a multi-bandgap quantum dot layer for use in a solar cell may include providing a first precursor compound, providing a second precursor compound, combining a portion of the first precursor compound with a portion of the second precursor compound to form precursor quantum dots through a process in which reaction parameters can be adjusted so that the precursor quantum dots are formed with different bandgap. The multi-bandgap quantum dot layer includes a plurality of quantum dots where at least some of the quantum dots differ in size.

Another example method for manufacturing a multi-bandgap quantum dot layer for use in a solar cell may include providing a cadmium-containing compound, providing a selenium-containing compound, combining the cadmium-containing compound with the selenium-containing compound to form a precursor quantum dot, and alloying the precursor quantum dot by performing cation exchange to form a multi-bandgap quantum dot layer that includes a plurality of quantum dots where at least some of the quantum dots differ in bandgap.

An example quantum dot solar cell may include a first electrode. An electron conductor may be electrically coupled to the first electrode. A multi-bandgap quantum dot layer may be electrically coupled to the electron conductor. The multi-bandgap quantum dot layer may include a plurality of quantum dots, where at least some of the quantum dots differ in bandgap. A hole conductor may be electrically coupled to the multi-bandgap quantum dot layer. A second electrode may be electrically coupled to the hole conductor.

The above summary of some embodiments is not intended to describe each disclosed embodiment or every implementation. The Figures and Description which follow more particularly exemplify certain illustrative embodiments.

BRIEF DESCRIPTION OF THE DRAWINGS

The invention may be more completely understood in consideration of the following detailed description of various embodiments of the invention in connection with the accompanying drawings, in which.

Figure 1:
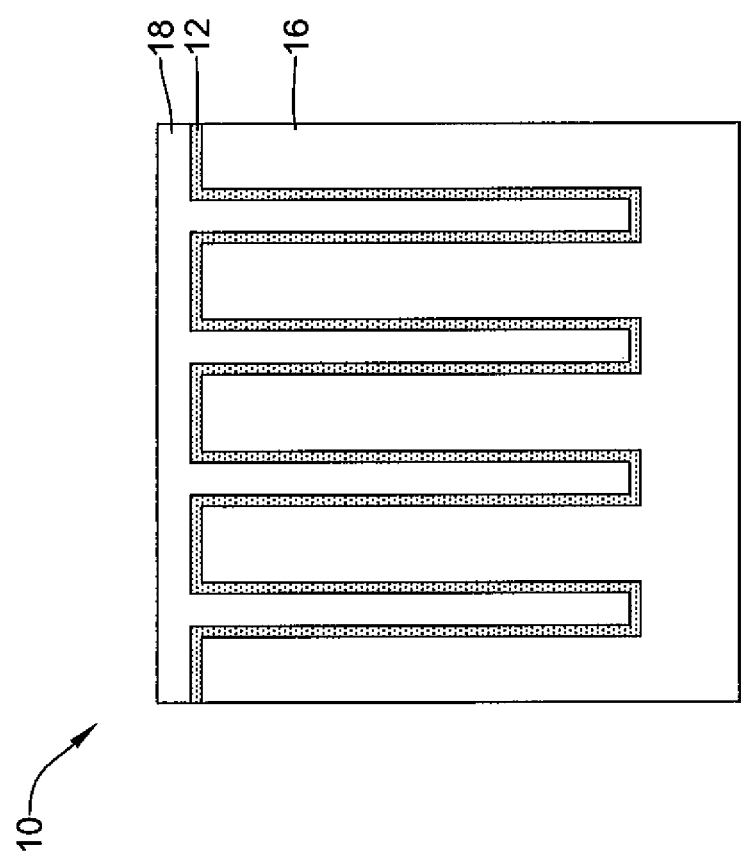
FIG. 1 is a schematic cross-sectional side view of an illustrative but non-limiting example of a solar cell.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DESCRIPTION

The following description should be read with reference to the drawings in which similar elements in different drawings are numbered the same. The drawings, which are not necessarily to scale, depict illustrative embodiments and are not intended to limit the scope of the invention.

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

FIG. 1 is a schematic cross-sectional side view of an illustrative solar cell 10. In the illustrative example shown in FIG. 1, there may be a three-dimensional intermingling or interpenetration of the various layers forming solar cell 10, but this is not required. The illustrative solar cell 10 includes a quantum dot layer 12. Quantum dot layer 12 may be considered as representing a large number of individual quantum dots. The illustrative solar cell 10 may also include an electron conductor layer 16. In some cases, electron conductor layer 16 may be an n-type conductor. While not required, a bifunctional ligand layer (not shown) may be disposed between electron conductor layer 16 and quantum dot layer 12. The bifunctional ligand layer may include a number of bifunctional ligands that are coupled to electron conductor layer 16 and to quantum dot layer 12. The illustrative solar cell 10 may further include a hole conductor layer 18. Hole conductor layer 18 may be a p-type conducting layer. In some cases, a first electrode (not explicitly shown) may be electrically coupled to the electron conductor layer 16, and a second electrode (not explicitly shown) may be coupled to the hole conductor layer 18, but this is not required in all embodiments. It is contemplated that solar cell 10 may include other structures, features and/or constructions, as desired.

Figure 2:
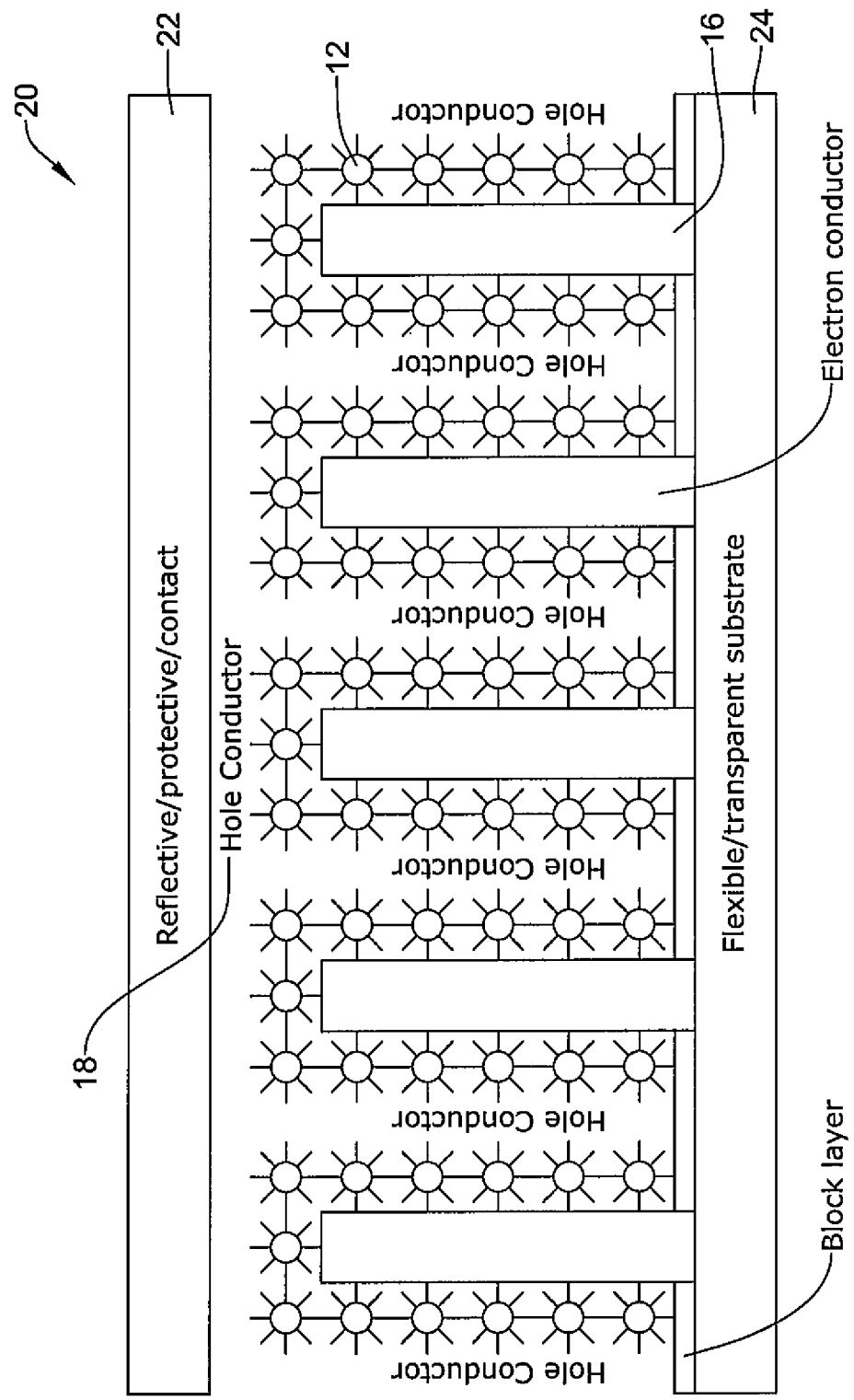
FIG. 2 is a schematic cross-sectional side view of another illustrative but non-limiting example of a solar cell.

FIG. 2 is a schematic cross-sectional side view of an illustrative solar cell 20 that is similar to solar cell 10 (FIG. 1). In some cases, a reflective and/or protecting layer 22 may be disposed over the hole conductor layer 18, as shown. When layer 22 is reflective, light may enter the solar cell 20 from the bottom, e.g. through the flexible/transparent substrate 24. Some of the light may pass through the active layer 12, which may then be reflected back to the active layer 12 by the reflective layer 22, thereby increasing the efficiency of the solar cell 20. When provided, the reflective and/or protecting layer 22 may be a conductive layer, and in some cases, may act as the second electrode discussed above with respect to FIG. 1. In some instances, the reflective and/or protecting layer 22 may include a Pt/Au/C film as both catalyst and conductor, but this is not required. The reflective and/or protecting layer 22 is optional.

In some cases, a flexible and transparent substrate 24, shown at the lower side (in the illustrated orientation) of FIG. 2, may be provided. In some cases, the flexible and transparent substrate 24 may be transparent or at least substantially transparent to at least some wavelengths of light within the visible and/or other desired portion of the electromagnetic spectrum. In some instances, the flexible and transparent substrate 24 may act as the first electrode discussed above, but this is not required. The flexible and transparent substrate 24 is optional.

In the illustrative embodiment of FIG. 2, electron conductor layer 16 may be in electrical communication with the flexible and transparent substrate 24, but this is not required. A quantum dot layer 12 may be provided over the electron conductor layer, followed by a hole conductor layer 18 as discussed above. As noted above, there may be a three-dimensional intermingling or interpenetration of certain layers forming solar cell 20, but this is not required.

In some cases, the electron conductor layer 16 be a metallic and/or semiconducting material, such as $TiO_2$ or ZnO. Alternatively, electron conductor layer 16 may be an electrically conducting polymer such as a polymer that has been doped to be electrically conducting and/or to improve its electrical conductivity. In at least some embodiments, electron conductor layer 16 may include an n-type conductor and/or form or otherwise be adjacent to the anode (negative electrode) of cell 10.

Hole conductor layer 18 may include a p-type conductor and/or form or otherwise be adjacent to the cathode (positive electrode) of cell 10. In some instances, hole conductor layer 18 may be a conductive polymer, but this is not required. The conductive polymer may, for example, be or otherwise include a functionalized polythiophene. An illustrative but non-limiting example of a suitable conductive polymer has

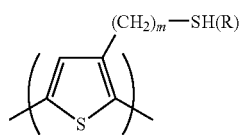

as a repeating unit, where R is absent or alkyl and m is an integer ranging from about 6 to about 12. The term "alkyl" refers to a straight or branched chain monovalent hydrocarbon radical having a specified number of carbon atoms. Examples of "alkyl" include, but are not limited to, methyl, ethyl, n-propyl, isopropyl, n-butyl, s-butyl, t-butyl, n-pentyl, n-hexyl, 3-methylpentyl, and the like.

Another illustrative but non-limiting example of a suitable conductive polymer has

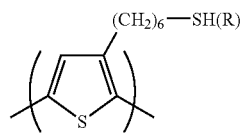

as a repeating unit, where R is absent or alkyl.

Another illustrative but non-limiting example of a suitable conductive polymer has

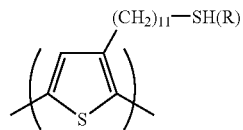

as a repeating unit, where R is absent or alkyl.

Another illustrative but non-limiting example of a suitable conductive polymer has

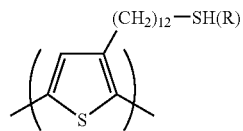

as a repeating unit, where R is absent or alkyl.

The quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb.

In some cases, the quantum dot layer 12 may include quantum dots that are all the same size is noted, however, that the bandgap of a quantum dot is typically size dependent. Thus, a quantum dot layer 12 that includes quantum dots that are all the same may have a substantially uniform bandgap. Because of this "uniform bandgap", such a quantum dot layer may only absorb light at or near a particular range of wavelengths of the electromagnetic spectrum. To provide absorption across a wider range of the electromagnetic spectrum, which may help increase the efficiency of the solar cell 20, it is contemplated that quantum dot layer 12 may be made to include quantum dots with a number of different bandgaps.

For example, some of the quantum dots in quantum dot layer 12 may include two elements. Some of the quantum dots may have one chemical formula (e.g, ZnSe) and some of the other quantum dots may have a different formula (e.g., CdSe).

These two different quantum dots (having differing bandgaps) may allow quantum dot layer 12 with a "multi-bandgap" quantum dot layer 12.

Still other quantum dots are contemplated for quantum dot layer 12 that include three or more elements. These quantum dots, which may be known as the alloyed quantum dots, may have a variety of different bandgaps depending on the content of different elements in the quantum dots. For example, some quantum dots in quantum dot layer 12 may have the general formula of $Cd_xZn_{1-x}Se$, where x is the fraction of Zn atoms among all Zn and Cd atoms in a quantum dot and may have a value that ranges from $0 \leqq x \leqq 1$. If x is 0, these quantum dots may have a bandgap that more closely resembles (e.g., is the same or about the same as) a quantum dot that includes ZnSe (e.g., about 2.7 eV). As x increases to 1, these quantum dots may have a bandgap that more closely resembles (e.g., is the same or about the same as) a quantum dots that includes CdSe (e.g., about 1.7 eV).

For purposes of this disclosure, a multi-bandgap quantum dot layer may be understood as including a plurality of constituents or subcomponents that have different bandgaps. Accordingly, a multi-bandgap quantum dot layer (e.g., quantum dot layer 12) may include a number of quantum dots with a variety of different bandgaps that span a wider range of energies. This may allow the quantum dots in quantum dot layer 12 to collectively absorb light from a wider range of wavelengths of the electromagnetic spectrum, which may help improve the efficiency of solar cell 20.

As alluded to above, in order to provide quantum dot layer 12 with a multi-bandgap range, quantum dot layer 12 may include a plurality of alloyed quantum dots that differ in bandgap. For example, quantum dot layer 12 may include two, three, four, five, six, seven, eight, or more different quantum dots with a differing bandgap (e.g., due to their differences in contents or sizes).

Forming such a quantum dot layer 12 may be accomplished using any number of processes, methods and/or techniques. In one example method, differently alloyed quantum dots are formed in quantum dot layer 12. This method may include providing a first precursor compound, providing a second precursor compound, and combining a portion of the first precursor compound with a portion of the second precursor compound to form precursor quantum dots. In some embodiments, one of the precursor compounds (e.g., the first precursor compound) may include cadmium. For example, one of the precursor compounds may include a cadmium nitrilotriacetic acid, $Cd(NO_3)_2$, or any other suitable cadmium-containing compound. The other precursor compound (e.g., the second precursor compound) may include selenium. For example, one of the precursor compounds may include $Na_2SeSO_3$.

The example method for forming quantum dot layer 12 may also include combining a portion of the first precursor compound with a portion of the second precursor compound to form a number of "base" or precursor quantum dots. The combining step may include a number of different methods. For example, the combining step may include dip coating a substrate into the first precursor compound and then into the second precursor compound. In at least some embodiments, the substrate may include a glass substrate such as a low-iron glass, fluoride-doped tin oxide glass, indium tin oxide glass, any other suitable glass, an electrically conductive material, or any other suitable material as desired. In some of these and in other embodiments, the substrate may be or include an electron conductor layer 16.

Dip coating may result in a layer or shell of the appropriate precursor compound(s) being deposited or otherwise formed on the substrate. The dip coating process may be repeated a number of times (e.g., a total of two, three, four, five, six, or more) so that the desired amount of the precursor compound (s) are disposed on the substrate and form the precursor quantum dots. It can be appreciated that as the number of dip coating cycles increases, the relative amount of material formed on the substrate increases and, thus, the size of the resultant precursor quantum dots formed as part of the process. This process may be repeated, to form layers of quantum dots, where each layer has different size (and thus bandgap) quantum dots. When forming each layer, the dip coating process may be changed by, for example, having a different number of dip coating steps, a different concentration of first and second precursor compounds, different first and second precursor compounds, different dip coating conditions such as temperature, pH, light conditions, and/or other conditions, etc. This may form a gradient in the bandgap through the quantum dot layer 12.

Alternatively, or in addition, the combining step may also include a chemical bath deposition. In one example, the substrate may be exposed to one or both of the precursor compounds (e.g., formulated as or otherwise including a chemical bath deposition solution) in a chemical bath deposition process. In some embodiments, a relatively low concentration of the chemical bath deposition solution may be utilized. For example, the concentration of the chemical bath deposition solution may be about 20-30 mmol/L, or about 25-30 mmol/L, or about 26-27 mmol/L, or about 26.7 mmol/L. The pH may also be controlled for the chemical bath deposition. For example, the pH of the chemical bath deposition process may be basic, about 9-12, about 10-11, or about 10.5. Additionally, the temperature of the chemical bath deposition may be controlled. For example, the chemical bath deposition may be conducted at a temperature of about 0-80° C., or about 4-20° C., or about 8-12° C., or about 10° C.

Variations to any one or more of the chemical bath deposition parameters may alter the amount of material deposited onto the substrate as part of the chemical bath deposition process and, thus, the size of the resultant quantum dots formed. For example, the concentration of the precursor compounds utilized in the chemical bath deposition may impact the amount of material deposited onto the substrate. Likewise, changes in pH temperature, light exposure (which may be controlled using, for example, a graduated filter), electrical current, etc. may be employed. Like above, such changes may form a gradient that results in differing amounts of material being deposited and, thus, the size of the resultant precursor quantum dots formed. These differences may be utilized in processes that include chemical bath deposition and ion exchange (described below) or in processes that omit ion exchange so that quantum dots (e.g., in quantum dot layer 12) may be formed in different sizes and so as to have different bandgaps.

In some cases, the above combining step may form a multi-bandgap quantum dot layer 12 that includes a plurality of quantum dots that differ in bandgap. In some of these and in other cases, the example process for forming quantum dot layer 12 may also include alloying the quantum dots formed above as part of the combining step(s) to form a multi-bandgap quantum dot layer 12. In some cases, this may include an ion exchange reaction with an appropriate alloying material. For example, the quantum dots formed as part of the above combining steps may be alloyed in an ion exchange reaction with $Zn^{2+}$. Other cations may be used such as those listed above from the pairs of materials that may be appropriate for forming quantum dots. When such cations are used, the precursor quantum dots may initially be at or near the same size.

The ion exchange reaction may include disposing the quantum dots formed as part of the combining step in the appropriate ion exchange solution (e.g., containing $Zn^{2+}$ or any other suitable alloying cation). The precursor quantum dot or dots, which may be formed as a layer, layers, or film, may have a total thickness of about 1-15 µm or about 3-10 µm or so. As the ion exchange solution penetrates into the precursor quantum dots, a natural concentration gradient is formed. Thus, differing concentrations of the ion exchange solution may be available along different portions of the precursor quantum dots, resulting is differing levels of ion exchange. For example, the precursor quantum dots may generally include cadmium and selenium and different alloyed quantum dots may be formed having a general formula of $Zn_xCd_{1-x}Se$, where x is the fraction of Zn atoms among all Zn and Cd atoms in a quantum dot. This may result in a quantum dot layer 12 having a multi-bandgap as x ranges between 0 and 1.

Some of the methods include portions or all or some the steps and/or processes described above. One example process may include a dip coating step and a chemical bath deposition step followed by an ion exchange step. The precursor quantum dots may initially be about the same size. In this method, the concentration gradient formed in the ion exchange process may lead to the formation of quantum dots (e.g., in quantum dot layer 12) that differ in bandgap.

Other example processes may include only a chemical bath deposition step, where gradients formed in temperature, light, electrical current, combinations thereof, and the like, or any other parameters, may be varied so that quantum dots (e.g., in quantum dot layer 12) may be formed that differ in bandgap.

While the cells 10 and method for manufacturing cells 10 disclosed herein are described in terms of solar cells, it should be appreciated that this disclosure is also applicable to other thin-film devices, such as light emitting diodes (LED's) and other devices. Consequently, to the extent applicable, this disclosure may analogously be applied to other thin film structures, as desired.

It should be understood that this disclosure is, in many respects, only illustrative. Changes may be made in details, particularly in matters of shape, size, and arrangement of steps without exceeding the scope of the invention. The invention's scope is, of course, defined in the language in which the appended claims are expressed.

What is claimed is:

1. A method for manufacturing a multi-bandgap quantum dot layer for use in a solar cell, the method comprising:
   providing a first precursor compound;
   wherein the first precursor compound includes cadmium nitrilotriacetic acid or $Cd(NO_3)_2$;
   providing a second precursor compound; and
   combining a portion of the first precursor compound with a portion of the second precursor compound to form a multi-bandgap quantum dot layer that includes a plurality of quantum dots that differ in bandgap.

2. The method of claim 1, wherein the first precursor compound includes cadmium.

3. The method of claim 2, wherein the first precursor compound includes a cadmium nitrilotriacetic acid.

4. The method of claim 2, wherein the first precursor compound includes $Cd(NO_3)_2$.

5. The method of claim 1, wherein the second precursor compound includes selenium.

6. The method of claim 1, wherein the combining step includes dip coating.

7. The method of claim 1, wherein the combining step includes chemical bath deposition.

8. The method of claim 1, further comprising alloying the multi-bandgap quantum dot layer.

9. The method of claim 8, wherein the alloying step includes ion exchange.

10. The method of claim 9, wherein the alloying step includes ion exchange with $Zn^{2+}$.

11. A method for manufacturing a multi-bandgap quantum dot layer for use in a solar cell, the method comprising:
    providing a first precursor compound;
    providing a second precursor compound, wherein the second precursor compound includes $Na_2SeSO_3$;
    combining a portion of the first precursor compound with a portion of the second precursor compound to form a multi-bandgap quantum dot layer that includes a plurality of quantum dots that differ in bandgap.

12. A method for manufacturing a multi-bandgap quantum dot layer for use in a solar cell, the method comprising:
    providing a cadmium-containing compound;
    providing a selenium-containing compound, wherein the selenium-containing compound includes $Na_2SeSO_3$;
    combining the cadmium-containing compound with the selenium-containing compound to form a precursor quantum dot, wherein the combining step includes dip coating, chemical bath deposition, or both; and
    alloying the precursor quantum dot by performing cation exchange to form a multi-bandgap quantum dot layer that includes a plurality of quantum dots, wherein at least some of the quantum dots differ in bandgap.

13. The method of claim 12, wherein the alloying step includes cation exchange with $Zn^{2+}$.

14. A method for manufacturing a multi-bandgap quantum dot layer for use in a solar cell, the method comprising:
    providing a cadmium-containing compound, wherein the cadmium-containing compound includes cadmium nitrilotriacetic acid;
    providing a selenium-containing compound;
    combining the cadmium-containing compound with the selenium-containing compound to form a precursor quantum dot, wherein the combining step includes dip coating, chemical bath deposition, or both; and
    alloying the precursor quantum dot by performing cation exchange to form a multi-bandgap quantum dot layer that includes a plurality of quantum dots, wherein at least some of the quantum dots differ in bandgap.

15. A method for manufacturing a multi-bandgap quantum dot layer for use in a solar cell, the method comprising:
    providing a cadmium-containing compound, wherein the cadmium-containing compound includes $Cd(NO_3)_2$
    providing a selenium-containing compound;
    combining the cadmium-containing compound with the selenium-containing compound to form a precursor quantum dot, wherein the combining step includes dip coating, chemical bath deposition, or both; and
    alloying the precursor quantum dot by performing cation exchange to form a multi-bandgap quantum dot layer that includes a plurality of quantum dots, wherein at least some of the quantum dots differ in bandgap.

16. A method for manufacturing a multi-bandgap quantum dot layer for use in a solar cell, the method comprising:
    forming a quantum dot layer using, at least in part, a chemical bath deposition process, wherein the quantum dot layer includes a plurality of quantum dots each having a bandgap; and
    wherein the forming step includes creating a gradient in the chemical bath deposition process, wherein the gradient causes the bandgap of the quantum dots of the quantum dot layer to vary in accordance with the gradient created in the chemical deposition process.

17. The method of claim 16, wherein the gradient includes a temperature gradient.

18. The method of claim 16, wherein the gradient includes a light gradient.

19. The method of claim 16, wherein the gradient includes an electric current gradient.

20. A method for manufacturing a multi-bandgap quantum dot layer for use in a solar cell, the method comprising:
   forming a quantum dot layer, wherein the quantum dot layer includes a plurality of quantum dots each having a bandgap;
   disposing the quantum dot layer in an ion exchange solution, such that a concentration gradient of the ion exchange solution is created in the quantum dot layer;
   removing the quantum dot layer from the ion exchange solution; and
   wherein the bandgap of the quantum dots in the quantum dot layer vary in accordance with the concentration gradient created in the quantum dot layer during the disposing step.

* * * * *